United States Patent [19]

Shang

[11] 3,727,115

[45] Apr. 10, 1973

[54] SEMICONDUCTOR ELECTROLUMINESCENT DIODE COMPRISING A TERNARY COMPOUND OF GALLIUM, THALLIUM, AND PHOSPHOROUS

[75] Inventor: David Ching-Ting Shang, Apalachin, N.Y.

[73] Assignee: International Business Machines Corporation, Armonk, N.Y.

[22] Filed: Mar. 24, 1972

[21] Appl. No.: 237,761

[52] U.S. Cl. ........317/235 R, 317/235 N, 317/235 R, 317/235 AQ, 148/175, 148/171

[51] Int. Cl. ..........H05b 33/00

[58] Field of Search ..........317/235 N, 235 R; 148/175

[56] References Cited

UNITED STATES PATENTS

| | | | |
|---|---|---|---|
| 3,611,069 | 10/1971 | Golginaitis | 317/235 |
| 3,649,382 | 3/1972 | Hawrylo | 148/171 |
| 3,692,593 | 9/1972 | Hawrylo et al. | 148/172 |
| 3,648,120 | 3/1972 | Hakki | 317/235 N |
| 3,617,820 | 11/1971 | Herzog | 317/234 |
| 3,667,007 | 5/1972 | Kressel | 317/235 R |
| 3,560,275 | 2/1971 | Kressel | 148/171 |
| 3,647,579 | 3/1972 | Ladany | 148/171 |
| 3,677,836 | 7/1972 | Lorenz | 148/171 |
| 3,614,549 | 10/1971 | Lorenz et al. | 317/234 |
| 3,619,304 | 11/1971 | Naito et al. | 148/171 |
| 3,604,991 | 9/1971 | Yonezu et al. | 317/235 R |
| 3,636,416 | 1/1972 | Umeda | 317/234 R |
| 3,690,964 | 9/1972 | Saul | 148/171 |

*Primary Examiner*—Martin H. Edlow
*Attorney*—Norman R. Bardales et al.

[57] ABSTRACT

A semiconductor electroluminescent diode, sometimes hereinafter referred to as a light emitting diode or simply LED, is a formed ternary compound of gallium, thallium and phosphorous. The diode is extremely versatile and has a variety of ambient temperature responsive operating characteristics which provide multiple light emitting characteristics. For example, at room temperature, i.e., 27°C, it emits light in the yellow bandwidth when forward biased and no light when reversed biased. At −196°C it has a bipolar characteristic. More specifically, at −196°C it has a discontinuous operating characteristic comprised of two portions when biased in the forward direction. In one portion, it emits light in the yellow bandwidth. In the other, it emits in the green bandwidth. When biased in the reverse direction and operating at the −196°C environment, it again exhibits a discontinuous operating characteristic having two portions and emits light in the yellow bandwidth in each portion.

10 Claims, 2 Drawing Figures

SEMICONDUCTOR ELECTROLUMINESCENT DIODE COMPRISING A TERNARY COMPOUND OF GALLIUM, THALLIUM, AND PHOSPHOROUS

BACKGROUND OF THE INVENTION

This invention is related to electroluminescent diodes and is particularly useful as a bipolar device.

Semiconductor electroluminescent diodes which exhibit multiple light emission characteristics are well known in the art. By way of example, in U.S. Pat. No. 3,366,819, which is assigned to the common assignee herein, there are described such type diodes in which the semiconductor material is a II–VI binary compound.

Semiconductor electroluminescent diodes formed of ternary compound materials are also known in the art. For example, U.S. Pat. No. 3,614,549, also assigned to the common assignee herein, describes electroluminescent diodes in which the semiconductor material is a III–V ternary compound. Some III–V diodes, e.g., GaAlP, have been found to exhibit multiple emission characteristics, see "LIGHT EMITTING DIODE,"-D. C. T. Shang, applicant herein, IBM Technical Disclosure Bulletin, Vol. 13, No. 11 April 1971, pages 3441–3442.

The need for new sources of semiconductor materials for fabricating electroluminescent diodes having different multiple light emission characteristics is thus readily apparent.

SUMMARY OF THE INVENTION

It is an object of this invention to provide a semiconductor electroluminescent diode having multiple light emission characteristics which is formed of the ternary compound of gallium, thallium and phosphorus.

According to one aspect of the invention there is provided a semiconductor electroluminescent PN junction diode apparatus having a semiconductor body which is formed from the ternary compound of gallium, thallium and phosphorus.

The foregoing and other objects, features and advantages of the invention will be apparent from the following more particular description of the preferred embodiments of the invention, as illustrated in the accompanying drawing.

BRIEF DESCRIPTION OF THE DRAWING

In the figures, like elements are designated with similar reference numbers.

DESCRIPTION OF THE PREFERRED EMBODIMENTS

Figure 1:
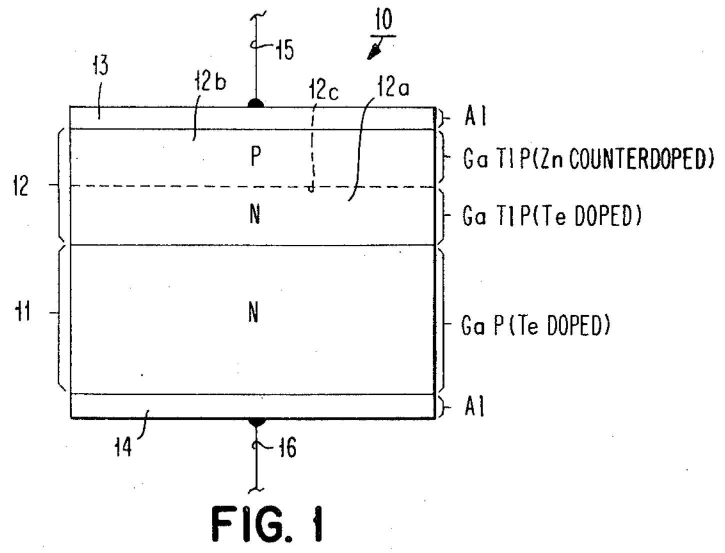
FIG. 1 is an enlarged schematic view of an apparatus embodiment of the electroluminescent diode of the present invention.

Referring to FIG. 1 light-emitting diode (LED) 10 has multiple discrete light emission wavelength characteristics. In accordance with the principles of the invention, the PN regions of LED 10 is of the GaTlP type. LED 10 basically comprises adjacent opposite-conductivity type regions N and P designated 12*a* and 12*b*, respectively, which form a PN junction 12*c* therebetween. The layer 12, i.e., regions 12*a* and 12*b*, are formed on a suitable substrate 11 and which is preferably maintained as part of the structure 10 to enhance the mechanical stability and ruggedness of the device. However, as is well known to those skilled in the art substrate 11 may be removed by any suitable process such as etching, polishing, or the like if desired in certain cases such as for example, when a more compact size is required. Suitable metallic layers 13, 14, e.g., aluminum, are affixed to the opposite surfaces of the LED 10 and act as electrodes for the device. An appropriate bias source, not shown, is adapted to be connected to the electrodes 13 and 14 via the respective conductors 15 and 16 shown connected to the latter by solder or the like.

By judiciously selecting the bias voltage input and ambient temperature, LED 10 exhibits multiple light emission characteristics. For example, at room temperature, i.e., 27° C, it has a normal current versus voltage characteristic when biased indicated by the dash line continuous curve shown in FIG. 2. At room temperature, when LED 10 is biased in the forward direction at a voltage sufficient to emit light, typically 2.5 volts, its wavelength emission characteristic is approximately 6,300 angstroms. It does not emit light at room temperature when biased in the reverse direction.

Figure 2:
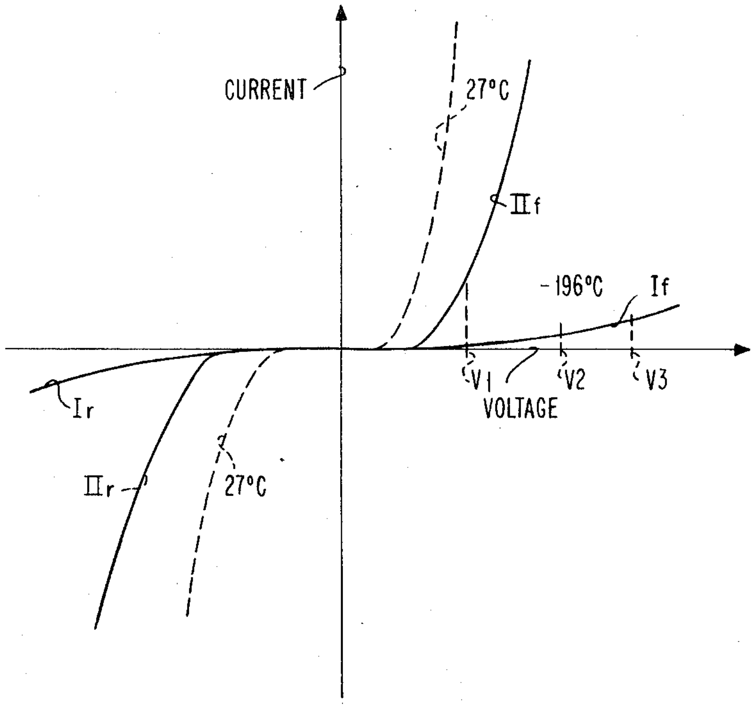
FIG. 2 is an idealized waveform diagram of the operating characteristics of a diode made in accordance with the principles of the present invention.

At −196°C, LED 10 exhibits a current versus voltage characteristic indicated by the solid line discontinuous curve of FIG. 2. To subject the LED to this temperature, it may be placed in a liquid nitrogen atmosphere. Under these temperature conditions, increasing the voltage in the forward direction will cause the LED to emit light at 6,300 angstroms when the voltage reaches V2, which is typically 20 volts, c.f. discontinuous curve portion If. The LED continues to emit light at this wavelength until the voltage V3, which is typically 30 volts, is reached. At V3, the LED "breaks down" and the voltage across it drops to V1, which is typically around 12 volts, c.f. discontinuous curve IIf. Moreover, the LED now emits a different wavelength of 5,700 angstroms. If the voltage is thereafter increased in the forward direction, the LED continues to emit at 5,700 angstroms, but the voltage across the LED becomes rapidly saturated in this direction, c.f. curve portion IIf. If the voltage is lowered in the reverse direction, the LED stops emitting when the voltage level drops below V1. Thereafter, if the voltage is increased in the forward direction and passes V1, the diode will not emit light until it reaches V2 whereupon it again emits light at 6,300 angstroms. The afore-described operating cycle must be repeated if it is desired to have it emit at 5,700 angstroms. That is to say, if the diode is emitting at 5,700 angstroms and is subsequently turned off, it must first be operated in the curve portion If of its characteristic to its "breakdown level" voltage V3 before it can again emit light at 5,700 angstroms.

A similar operation occurs in the reverse direction as shown by the discontinuous curve portions I*r*, and II*r*, except that the LED emits at the same wavelength of 6,300 angstroms for both.

A typical and preferred method of the invention for making the diode structure 10 is as follows:

First, there is provided an N-doped substrate 11 of GaP (ratio 1:1) using Te as the dopant in a concentration of $1 \times 10^{18}$ per cc of GaP.

Next, a mix of 20 gms of Ga, 3 gms of GaP (ratio 1:1), 0.5779 gms of T1, and an N dopant of 20 milligrams of Te is provided and melted at a temperature of 1,100°C for approximately 10 minutes. The melt is then cooled to a temperature of 1,050°C at a rate of ½°C per minute.

Next, substrate 11 is immersed in the melt when temperature 1,050°C is reached, and an N-region 12 is epitaxial solution grown on an appropriate surface of the substrate 11 by cooling the melt to a temperature of 990°C at a rate of ½°C per minute.

When the melt reaches the 990°C temperature, a P-region **12*b* is diffused inwardly in the N-region 12** by adding a sufficient quantity, e.g., 100 milligrams, of Z*n* as a P counter-dopant to the melt and thereafter cooling to a temperature of 935°C at a rate of ½°C per minute.

When the temperature of the melt reaches 935°C, the structure 10 is removed from the melt and cleaned. The structure 10 now has the N and P-regions **12*a* and 12*b*, respectively, and PN junction 12*c* of the diode formed on the substrate 11**. The heating steps of the process are performed in a forming gas atmosphere of 90%N and 10%H.

As is apparent to those skilled in the art, diode 10 can be fabricated either as an edge and/or surface emitter types. In the edges emitter type, the light emanates from the PN junction in a direction generally parallel to the plane of the PN junction. In surface types, the light emanates from the PN junction in a direction generally normal to its plane. For example, region **12*b*, is sufficiently non-opaque so that the light emanating from junction 12*c* will pass through it. To provide LED 10 as a surface emitter type, electrode 13** is provided as a transparent type so that the light can also pass through it.

The present invention contemplates the formation of the aforementioned electroluminescent diode as discrete elements as well as a monolithic array of such diodes. Thus, it should be understood that while the invention has been particularly shown and described with reference to preferred embodiments, it will be understood by those skilled in the art that the foregoing and other changes in form and detail may be made therein without departing from the spirit and scope of the invention.

I claim:

1. In semiconductor electrolumincescent PN junction diode apparatus having a semiconductor body with first and second adjacent opposite-conductivity type regions providing a PN junction of said apparatus therebetween, said semiconductor body comprising a ternary compound of gallium, thallium and phosphorus to provide said diode apparatus with multiple light emission characteristics.

2. Semiconductor electroluminescent diode apparatus comprising:

a semiconductor body of the ternary compound gallium, thallium and phosphorus, said body having a first region of a predetermined conductivity type, and a second region of opposite conductivity diffused in said first region, said first and second regions forming a PN junction therebetween;

first and second electrode means in respective predetermined coupling relationships with said first and second regions, respectively, said PN junction emitting light therefrom with multiple light-emission characteristics in response to the voltage applied across said first and second electrode means the ambient temperature.

3. Diode apparatus according to claim 2 wherein at least one of said multiple light emission characteristics include selectable first and second different emission wavelengths at a predetermined temperature when said diode apparatus is biased in a given direction.

4. Diode apparatus according to claim 3 wherein said first and second emission wavelengths are 5,700 and 6,300 angstroms, respectively, and said predetermined direction is the forward bias direction.

5. Diode apparatus according to claim 2 wherein said diode apparatus further comprises a semiconductor substrate for supporting said first region, said first region being epitaxial solution grown thereon and said first electrode means being affixed to said substrate, said substrate providing said coupling relationship of said first electrode means to said first region.

6. Diode apparatus according to claim 2 wherein said first and second regions are of N and P conductivity types, respectively.

7. Diode apparatus according to claim 5 wherein said substrate is a gallium phosphorus compound.

8. The method of making a semiconductor electroluminescent diode having multiple light-emission characteristics, said method comprising the steps of:

providing an N-doped gallium phosphorus substrate with a predetermined tellurium dopant concentration;

providing a mix with the ingredients of gallium, the alloy of gallium phosphorus, thallium, and an N-dopant of tellurium melted at a temperature of 1,100°C for approximately 10 minutes;

thereafter cooling the melt to a temperature of 1,050°C at a rate of ½°C per minute;

thereafter emersing the substrate in the melt to epitaxial solution grow an N-region on a predetermined surface of said substrate by cooling the melt to a temperature of 990°C at a rate of ½°C per minute;

thereafter diffusing a P-region inwardly in the N-region by adding a sufficient quantity of zinc as a P-counter-dopant to the melt and thereafter cooling the melt to a temperature of 935°C at a rate of ½°C per minute;

thereafter removing the substrate and the resultant P and N regions formed thereon from the melt when the latter reaches the aforesaid temperature of 935°C.

9. The method according to claim 8 wherein the intermediate steps are performed in a forming gas atmosphere of 90 percent nitrogen and 10 percent hydrogen.

10. The method according to claim 8 wherein:

the ratio of gallium and phosphorus in said substrate is 1:1;

said tellurium dopant concentration in said substrate is $1 \times 10^{18}$ per cc of gallium phosphorus;

the ratio of said gallium and phosphorus in said alloy of said mix is 1:1; and the proportions of the gallium, gallium phosphorus alloy, thallium and tellurium dopant of said mix is: 20:3:0.5779:0.020, respectively.

* * * * *